United States Patent
Umezawa et al.

(10) Patent No.: US 9,612,931 B2
(45) Date of Patent: Apr. 4, 2017

(54) SYSTEM AND METHOD FOR SYNCHRONOUSLY CONTROLLING LED ON MULTIPLE CONTROL MODULES BASED ON A REGISTER SYNCHRONIZED WITH SYNCHRONOUS PACKETS

(71) Applicant: Hitachi, Ltd., Tokyo (JP)

(72) Inventors: Akihiro Umezawa, Tokyo (JP); Nobuo Yagi, Tokyo (JP); Kazuki Sato, Tokyo (JP)

(73) Assignee: HITACHI, LTD., Tokyo (JP)

( * ) Notice: Subject to any disclaimer, the term of this patent is extended or adjusted under 35 U.S.C. 154(b) by 298 days.

(21) Appl. No.: 14/295,607

(22) Filed: Jun. 4, 2014

(65) Prior Publication Data

US 2014/0365629 A1 Dec. 11, 2014

(30) Foreign Application Priority Data

Jun. 5, 2013 (JP) ................................ 2013-118914

(51) Int. Cl.
*G06F 1/04* (2006.01)
*G06F 15/16* (2006.01)
(Continued)

(52) U.S. Cl.
CPC .. *G06F 11/325* (2013.01); *G05B 2219/31213* (2013.01); *G06F 11/3031* (2013.01); *G06F 11/3058* (2013.01); *G06F 13/4243* (2013.01); *G06F 17/5027* (2013.01); *G06F 17/5054* (2013.01); *H04N 13/0051* (2013.01); *H04N 13/0296* (2013.01); *H04N 21/4302* (2013.01); *H04N 21/633* (2013.01); *H04N 21/64746* (2013.01)

(58) Field of Classification Search
CPC ............. G06F 17/5054; G06F 17/5027; G06F 13/4243; G05B 2219/31213; H04N 13/0051; H04N 21/633; H04N 21/4302; H04N 21/64746; H04N 13/0296
See application file for complete search history.

(56) References Cited

U.S. PATENT DOCUMENTS 7,840,675 B2 11/2010 Ishiki et al.
8,519,739 B1 * 8/2013 Leon ................... G06F 15/7867
326/38

(Continued)

FOREIGN PATENT DOCUMENTS

JP 2010-009628 A 1/2010
JP 2010-079467 A 4/2010

*Primary Examiner* — Xuxing Chen
(74) *Attorney, Agent, or Firm* — Volpe and Koenig, P.C.

(57) ABSTRACT

In an information processing system, plural information processing devices are mutually connected by an SMP connection mechanism. Each of the information processing devices includes a control device (FPGA) having a synchronous register that shows the state of a control signal of the information processing device and an internode communication access control unit that transmits first synchronous packets with the content of the synchronous register reflected to the other information processing devices at predetermined time intervals, receives second synchronous packets from the other information processing devices, and reflects the content of the received second synchronous packets on the synchronous register.

7 Claims, 8 Drawing Sheets

(51) Int. Cl.
*G06F 1/12* (2006.01)
*G06F 11/32* (2006.01)
*G06F 17/50* (2006.01)
*H04N 13/02* (2006.01)
*H04N 13/00* (2006.01)
*H04N 21/633* (2011.01)
*H04N 21/647* (2011.01)
*G06F 13/42* (2006.01)
*H04N 21/43* (2011.01)
*G06F 11/30* (2006.01)

(56) References Cited

U.S. PATENT DOCUMENTS

| | | | | |
|---|---|---|---|---|
| 2009/0195952 | A1* | 8/2009 | Meagher | G05B 19/0425 361/84 |
| 2010/0128998 | A1* | 5/2010 | Wegener | G06T 9/00 382/248 |
| 2010/0180065 | A1* | 7/2010 | Cherian | G06F 12/0804 711/103 |
| 2011/0267854 | A1* | 11/2011 | Flannery | H02M 7/493 363/72 |
| 2012/0036387 | A1* | 2/2012 | Nakashima | G06F 11/0727 713/340 |

* cited by examiner

SYSTEM AND METHOD FOR SYNCHRONOUSLY CONTROLLING LED ON MULTIPLE CONTROL MODULES BASED ON A REGISTER SYNCHRONIZED WITH SYNCHRONOUS PACKETS

INCORPORATION BY REFERENCE

This application claims priority based on a Japanese patent application, No. 2013-118914 filed on Jun. 5, 2013, the entire contents of which are incorporated herein by reference.

BACKGROUND OF THE INVENTION

The present invention relates to an information processing system having a synchronous control mechanism among plural information processing devices.

With the recent development of an information society, there have been increased opportunities of handling a large amount of electronic data. Further, server devices and storage devices capable of handling a large amount of electronic data are essential for the growth of companies. In particular, there are many cases where the processing capacities of server devices need to be extended. As extension means of operation capacities in conventional server devices, there are two methods called "scale-out" and "scale-up".

For example, in a system in which a processor, a memory, a chipset, an I/O controller, and a storage device (HDD and SSD) are integrated into one information processing device module as represented by an information processing device called "blade server" among the types of server devices, the scale-out method is a method in which the processing capacity of the entire system is extended by newly adding an information processing device module. This method is particularly effective in the case where a dependency relationship of data processed in each information processing device module is weak. However, in the case where the dependency relationship of data is strong, it is difficult to extend the operation capacities by the scale-out method.

On the other hand, as represented by a large-scale SMP (Symmetric Multi Processing) configuration, the scale-up method is a method in which the capacities of a processor and a memory of an existing information processing device are improved by addition or replacement, so that the processing capacity of the entire system is extended. This method is effective in the case where a large amount of data that is strong in the mutual dependency relationship is processed. However, it is necessary to preliminarily estimate the processing capacity that would be needed in the future in detail at the time of introducing the information processing device. In addition, the scale-up method is inferior to the scale-out method in costs such as the excessive cost at the time of introduction and the cost at the time of extending the system after the introduction.

In order to address the problems, Japanese Patent Laid-Open No. 2010-009628 describes a technique of connecting two or more server modules that are information processing device modules by SMP connection in a blade server device, and the scale-up method as well as the scale-out method that is a conventional extension method of a blade server device can be realized.

Further, Japanese Patent Laid-Open No. 2010-079467 realizes the simplification of backplane wirings and a low cost at the time of introducing a server device by using an SMP connection method via an SMP connection device that can be directly attached or detached to/from the server module, instead of an SMP connection method via a substrate called "backplane" on which server modules are aggregated.

SUMMARY OF THE INVENTION

Each of Japanese Unexamined Patent Application Publication Nos. 2010-009628 and 2010-079467 describes a technique of mutually connecting processors of plural server modules and synchronization of timings of clock signals. In the case where plural server modules are connected to each other by SMP connection in a blade server, there are many control signals the states of which need to be synchronized, in addition to signals between processors and clock signals. The required number of control signals and the wiring topology thereof differ depending on the type of platform of the information processing device and a mounted I/O controller, and thus wirings of an existing SMP connection device disadvantageously become complicated. In addition, there is a method in which a control signal is connected to a BMC and BMC F/W (firmware) synchronizes the states of plural information processing devices with each other via a LAN. However, the transmission time of data cannot be ensured in a state synchronous process using the BMC F/W and LAN, and thus the method cannot be disadvantageously applied to a signal having not-strict time pressure.

An object of the present invention is to synchronize the states of control signals with each other in plural information processing devices in an information processing system in which the plural information processing devices are mutually connected by an SMP connection mechanism.

In a disclosed information processing system, plural information processing devices are mutually connected by an SMP connection mechanism. Each of the information processing devices includes a control device (FPGA) having a synchronous register that shows the state of a control signal of the information processing device and an internode communication access control unit that transmits first synchronous packets with the content of the synchronous register reflected to the other information processing devices at predetermined time intervals, receives second synchronous packets from the other information processing devices, and reflects the content of the received second synchronous packets on the synchronous register.

According to the present invention, it is possible to realize synchronous control of the states of control signals that need to be synchronized with each other in plural information processing devices.

DETAILED DESCRIPTION OF THE INVENTION

Embodiments of synchronizing the states of control signals with each other in plural information processing devices that are mutually connected by an SMP connection mechanism will be described using first to fourth embodiments while using an example in which the control signals are power saving control signals, flashing control signals of an LED, failure processing control (notification) signals, power source control signals, and control signals of a storage device.

First Embodiment

Figure 1:
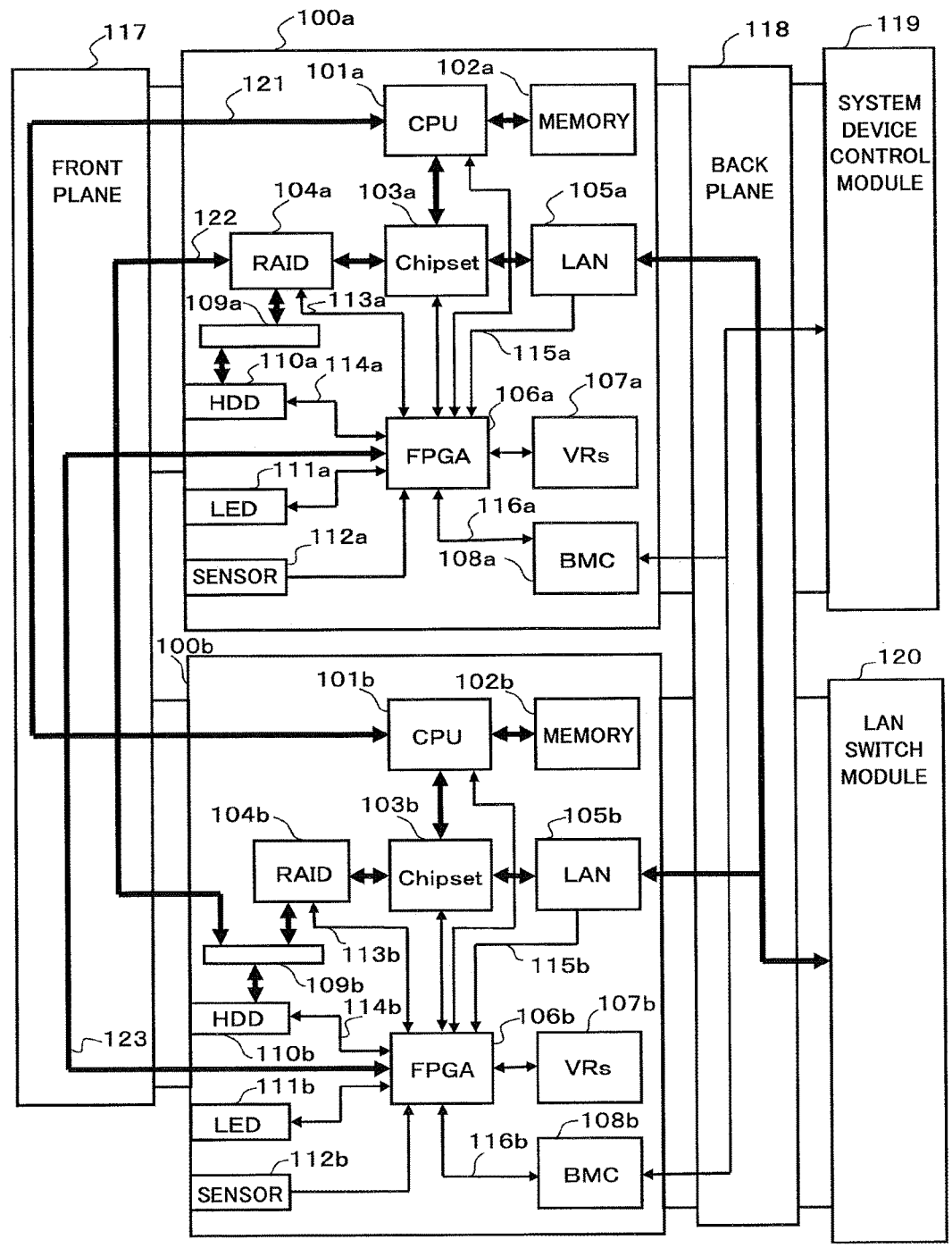
FIG. 1 shows an example of a configuration diagram of an information processing system using synchronous control via FPGAs.

In the embodiment, an example of synchronizing power saving control among plural information processing devices will be described. FIG. 1 shows an example of a configuration diagram of an information processing system using synchronous control through an FPGA (control device: control device using a field-programmable gate array) in an information processing device.

An information processing device 100a includes a processor (CPU) 101a, a memory 102a, a chipset 103a, an RAID controller 104a, a LAN controller 105a, an FPGA 106a, a power source (VRs) 107a, a BMC (Base Management Controller) 108a, a storage device selector switch 109a, a storage device (HDD) 110a, an LED 111a, and a temperature sensor 112a.

The BMC 108a is connected to a system device control module 119 using a LAN arranged in a backplane 118. The BMC 108a is connected to the FPGA 106a using a transmission channel 116a for a general-purpose I/F (I2C: Inter-Integrated Circuit) and an SPI (System Packet Interface), and can indirectly control various devices connected to the FPGA 106a through the FPGA 106a.

The RAID controller 104a is connected to the storage device 110a through the storage device selector switch 109a. Further, the RAID controller 104a has a control signal to manage the state of the storage device 110a, and is connected to the FPGA 106a using a transmission channel 113a. Further, the storage device 110a has the control signal used by the RAID controller 104a to manage the state of the storage device 110a, and is connected to the FPGA 106a using a transmission channel 114a.

The LAN controller 105a is connected to a LAN switch module 120 using the LAN arranged in the backplane 118. Further, the LAN controller 105a has a control signal to turn on the information processing device 100a from the LAN controller 105a, and is connected to the FPGA 106a through a transmission channel 115a.

The FPGA 106a is connected to the processor 101a, the chipset 103a, the VRs 107a, the LED 111a, and the temperature sensor 112a using general-purpose input/output pins (GPIO). Further, the FPGA 106a is mutually connected to an FPGA 106b of another information processing device 100b having the same configuration as the information processing device 100a through a front plane 117 using a full-duplex serial I/F transmission channel 123.

The processor 101a is mutually connected to a processor 101b of the information processing device 100b through the front plane 117 using a transmission channel 121. It should be noted that signals on the transmission channel 121 include only signals transferring effective data between the information processing devices, and do not include control signals necessary between the processors of the information processing devices. The control signal of the processor in each information processing device is connected to the FPGA in each information processing device.

The RAID controller 104a is connected to a storage device 110b via a storage device selector switch 109b of the information processing device 100b using a transmission channel 122 through the front plane 117. It should be noted that signals on the transmission channel 122 include only signals transferring effective data between the RAID controller 104a in the information processing device 100a and the storage device 110b in the information processing device 100b, and do not include control signals necessary between the RAID controller 104a and the storage device 110b.

The FPGA 106a transmits synchronous packets of data of a state input from the general-purpose I/F or the general-purpose input/output pins to the FPGA 106b of the information processing device 100b using the transmission channel 123 at predetermined time intervals. Further, the FPGA 106b having received the synchronous packets decodes the received data to be reflected on the state of the general-purpose input/output pins. Further, the FPGAs are connected to each other using the full-duplex I/F, and thus the FPGAs can simultaneously transmit and receive the synchronous packets. Hereinafter, a mechanism to synchronize the states of the FPGAs of the different information processing devices using the synchronous packets is referred to as a synchronous control mechanism of the FPGA.

In a conventional technique, control signals of processors, chipsets, RAID controllers, and storage devices need to be arranged in a front plane or a backplane among plural information processing devices. However, the control signals are aggregated into the FPGAs in the information processing devices and the synchronous control mechanism of the FPGAs is used in the embodiment, so that lines for the control signals are not needed on the front plane or the backplane.

Figure 2:
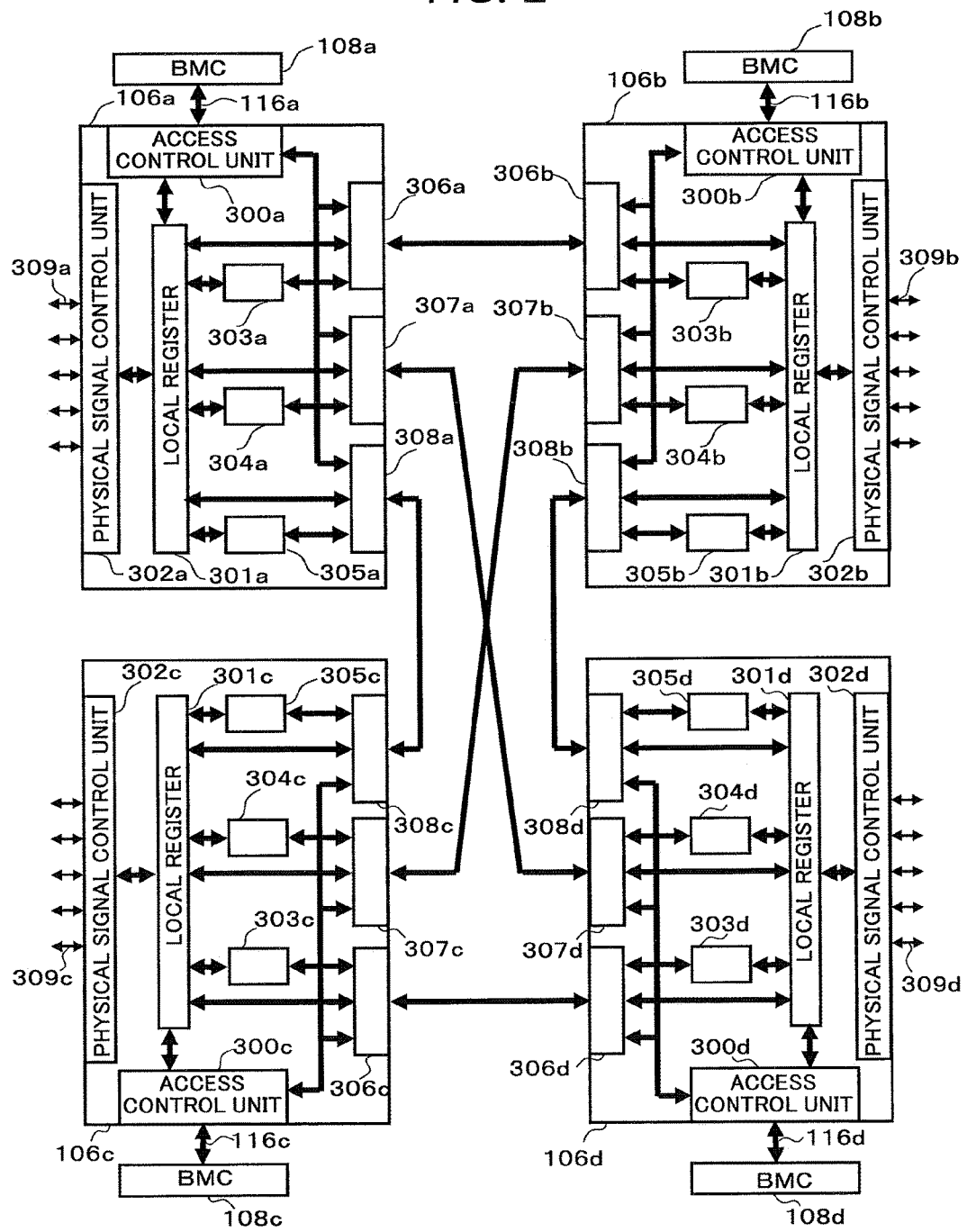
FIG. 2 shows an example of configurations of the FPGAs having a synchronous control mechanism.

FIG. 2 shows an example of a configuration of the FPGAs having the synchronous control mechanism. The FPGA 106a includes a BMC access control unit 300a, a local register 301a, a physical signal control unit 302a, synchronous registers 303a to 305a, and internode communication access control units 306a to 308a. The physical signal control unit 302a has plural general-purpose input/output pins (GPIO), and is connected to various devices such as the processor 101a, the chipset 103a, the RAID controller 104a, the storage device (HDD or SSD) 110a, the LAN controller 105a, the power source (VRs) 107a, the LED 111a, and the temperature sensor 112a in the information processing device 100a using transmission channels 309a.

The BMC 108a is connected to the BMC access control unit 300a of the FPGA 106a through the transmission channel 116a of the general-purpose I/F (I2C or SPI). The BMC 108a can access the local register 301a of the FPGA 106a using the general-purpose I/F.

The state of a part of the local register 301a of the FPGA 106a is reflected on a part of the general-purpose input/output pins via the physical signal control unit 302a. On the contrary, the state of another part of the general-purpose input/output pins provided in the physical signal control unit 302a of the FPGA 106a is reflected on another part of the local register 301a.

The FPGA 106a is mutually connected to other FPGAs 106b, 106c, and 106d having the same configuration as the FPGA 106a through the internode communication access control units 306a to 308a using the full-duplex serial I/F.

The number of synchronous registers 303a to 305a and the number of internode communication access control units 306a to 308a of the FPGA 106a are the same as that of FPGAs 106 that are mutually connected in the information processing system. Synchronous data of each FPGA 106 is stored in the respective synchronous registers 303 to 305 of each FPGA 106, and the priority of internode communications is controlled by each of the internode communication access control units 306 to 308. For example, in the case where the FPGA 106a in the information processing device 100a is mutually connected to the FPGAs 106 of three other information processing devices, the FPGA 106a has three synchronous registers 303a to 305a. Further, the synchronous data with the FPGA 106b of the information processing device 100b is stored in the synchronous register 303a, the synchronous data with the FPGA 106d of the information processing device 100d is stored in the synchronous register 304a, and the synchronous data with the FPGA 106c of the information processing device 100c is stored in the synchronous register 305a. The synchronous data in each of the synchronous registers 303a to 305a is reflected on the state of the general-purpose input/output pins provided in the physical signal control unit 302a via the local register 301a and the like.

In the case where the BMC 108a accesses the BMC access control unit 300a of the FPGA 106a through the general-purpose I/F, the BMC access control unit 300a determines whether or not the access is for the FPGA 106a in the information processing device 100a. In the case where the determination result is true (in the case where the access is for the FPGA 106a), the BMC access control unit 300a reads or writes data from/into the local register 301a in the FPGA 106a, and returns the access result to the BMC 108a. In the case where the determination result is false, the BMC access control unit 300a transfers a transaction to appropriate one of the internode communication access control units 306a to 308a.

The internode communication access control units 306 to 308 generate and transmit two kinds of packets, namely, synchronous packets to synchronize the synchronous registers 303 to 305 among the FPGAs 106 of the information processing devices 100, and internode communication packets used by each BMC 108 to read or write data from/into the local register 301 of the FPGA 106 of one of the other information processing devices 100. Since the synchronous packets and the internode communication packets are mixed on the same I/F, the internode communication access control units 306 to 308 control the priority of the transmission packets. Further, the internode communication access control units 306 to 308 can simultaneously transmit and receive the packets. The synchronous registers (303a to d, 304a to d, and 305a to d) shown in FIG. 2 have the same configuration, and the internode communication access control units (306a to d, 307a to d, and 308a to d) have the same configuration.

Figure 3:
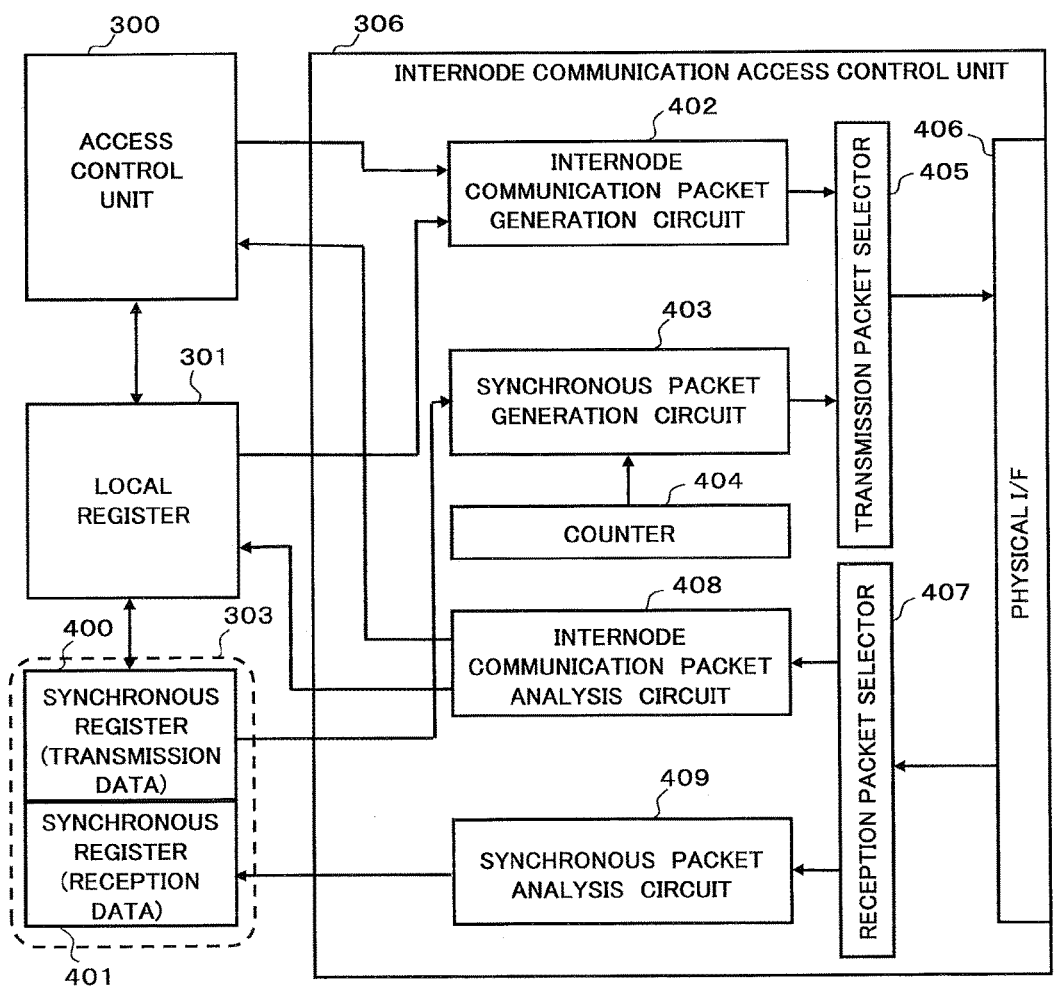
FIG. 3 shows an example of a configuration of the synchronous control mechanism.

FIG. 3 shows an example of a configuration of the synchronous control mechanism. The internode communication access control unit 306 is connected to the BMC access control unit 300, the local register 301, and the synchronous register 303. The synchronous register 303 is configured using a transmission data unit 400 and a reception data unit 401. Further, the internode communication access control unit 306 includes an internode communication packet generation circuit 402, a synchronous packet generation circuit 403, a synchronous packet generation counter 404, a transmission packet selector 405, an internode communication physical I/F 406, a reception packet selector 407, an internode communication packet analysis circuit 408, and a synchronous packet analysis circuit 409.

The synchronous packet generation circuit 403 of the internode communication access control unit 306 generates the synchronous packets from the synchronous data stored in the synchronous register (transmission data) 400 at the timing when the synchronous packet generation counter 404 is finished (when a predetermined time passes). The generated synchronous packets are transmitted to the FPGAs 106 of the other information processing devices 100 via the transmission packet selector 405. The synchronous packet generation counter 404 starts to count from the time the system starts to operate, and the value of the counter is reset when the counter is finished. A predetermined time until the synchronous packet generation counter 404 is finished is constant.

The internode communication packet generation circuit 402 of the internode communication access control unit 306 generates the internode communication packets at the timing when a request for internode communications is made via the BMC access control unit 300 from the BMC 108. The generated internode communication packets are transmitted to the FPGAs 106 of the other information processing devices 100 via the transmission packet selector 405.

The transmission packet selector 405 controls the priority of the synchronous packets and the internode communication packets, and controls the transmission delay of the packets. In the case where one of the synchronous packet and the internode communication packet is generated during transmission of the other, the transmission packet selector 405 delays the transmission of the newly-generated one until the transmission of the other being transmitted is completed. Further, in the case where the synchronous packet and the internode communication packet are simultaneously generated, the transmission packet selector 405 gives priority to the synchronous packet to be transmitted, and the internode communication packet is transmitted after the transmission of the synchronous packet is completed.

In the case where the synchronous packets or the internode communication packets are received from the FPGAs 106 of the other information processing devices 100, the reception packet selector 407 determines the type of the received packets, and appropriately transfers the same to one of the internode communication packet analysis circuit 408 or the synchronous packet analysis circuit 409 in accordance with the determination result.

The internode communication packet analysis circuit 408 analyzes the request of the received internode communication packets, and reads or writes data from/into the local register 301. Alternatively, the internode communication packet analysis circuit 408 transfers the result of the internode communications to the BMC 108 via the BMC access control unit 300.

The synchronous packet analysis circuit 409 analyzes the synchronous data from the received synchronous packets to be stored into the synchronous register (reception data) 401.

Figure 4:
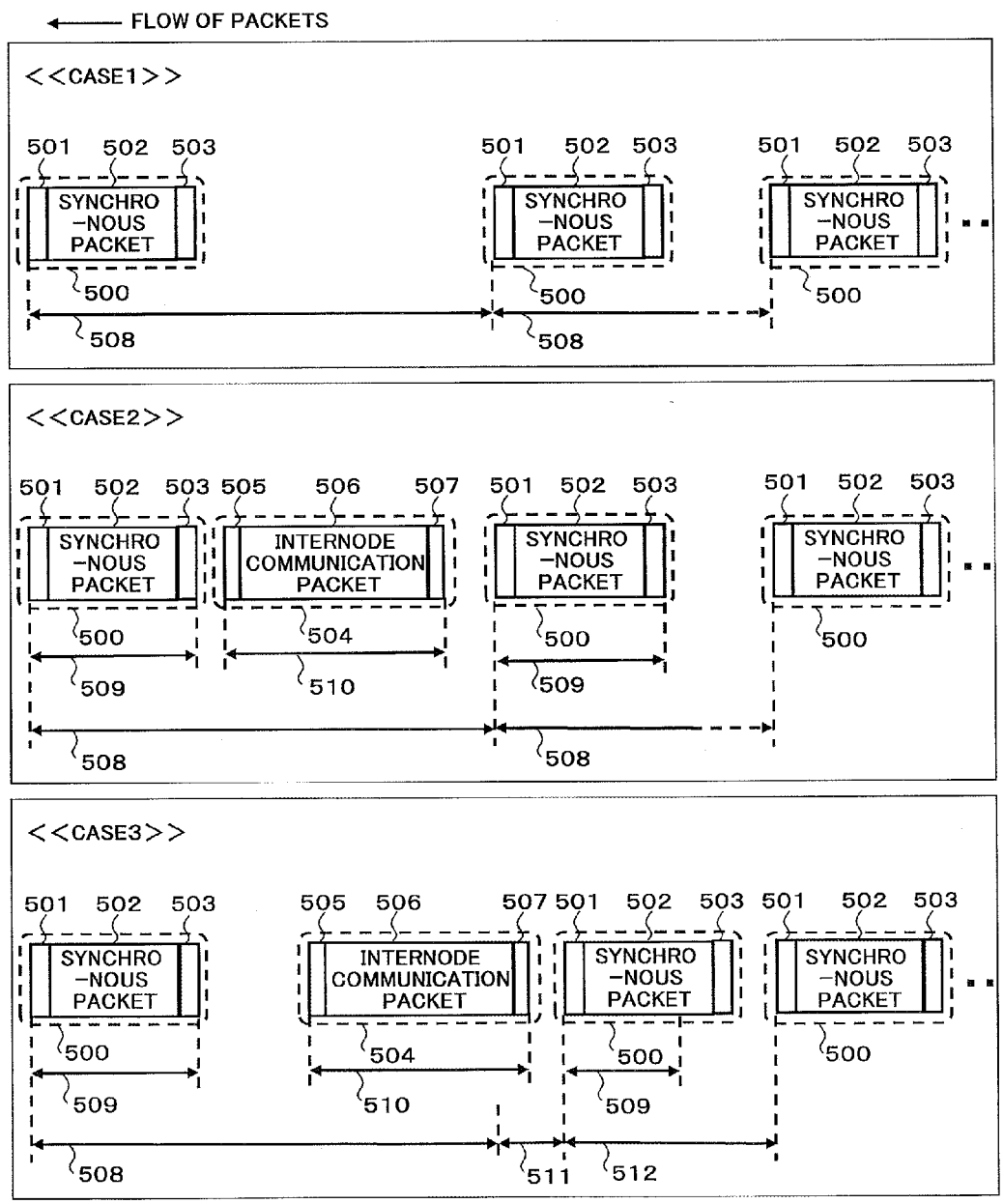
FIG. 4 is a diagram for showing an example of a control method to ensure the synchronous time of synchronous registers of the FPGAs using synchronous packets.

FIG. 4 shows an example of a control method to ensure the synchronous time of the synchronous register 303 of the FPGA 106 using the synchronous packets. A synchronous packet 500 includes a header section 501, a data section 502, and an error detection or correction section 503. The synchronous data stored in the synchronous register 303 in the FPGA 106 is stored in the data section 502 of the synchronous packet 500.

An internode communication packet 504 includes a header section 505, a data section 506, and an error detection or correction section 507. Transfer information of access transactions, response data, and the like from the BMC 108 are stored in the data section 506 of the internode communication packet 504.

The FPGA 106 (specifically, the transmission packet selector 405 and the reception packet selector 407) determines the type of packets by referring to the header sections 501 and 505 of the synchronous packets 500 and the internode communication packets 504. Further, the FPGA 106 confirms the consistency of the packets using the error detection or correction sections 503 and 507 of the synchronous packets 500 and the internode communication packets 504.

A case 1 of FIG. 4 shows an example of a transmission interval time of the synchronous packets 500. In the case where the synchronous packet 500 is transmitted, the FPGA 106 transmits the next synchronous packet 500 after a predetermined time 508. The transmission interval of the synchronous packet 500 is the certain predetermined time 508 unless the transmission of the synchronous packet 500 interferes with that of the internode communication packet 504.

A case 2 of FIG. 4 shows a case where the internode communication packet 504 is transmitted, and a case where the transmission of the synchronous packet 500 does not interfere with that of the internode communication packet 504. In general, the internode communication packet 504 is transmitted between the transmissions of the synchronous packets 500. A transmission time 510 of the internode communication packet 504 is made shorter than the half the synchronous packet transmission interval time 508.

A case 3 of FIG. 4 shows a case where the internode communication packet 504 is transmitted, and a case where the transmission of the synchronous packet 500 interferes with that of the internode communication packet 504. In the case where the synchronous packet transmission interval time 508 passes during the transmission of the internode communication packet 504, the FPGA 106 does not immediately transmit the synchronous packet 500, but waits until the transmission of the internode communication packet 504 is completed. The FPGA 106 transmits the synchronous packet 500 after the transmission of the internode communication packet 504 is completed. The FPGA 106 transmits the next synchronous packet 500 after a time 512 obtained by subtracting a transmission delay time 511 of the synchronous packet 500 generated at this time from the synchronous packet transmission interval time 508. The above-described control ensures twice the synchronous packet transmission interval time (508) as the synchronous time of the synchronous register 303 of the FPGA 106.

Further, in the case where the transmission start timing of the synchronous packet 500 is the same as that of the internode communication packet 504, the FPGA 106 gives priority to the synchronous packet 500 to be issued.

Under the above-described control, the synchronization of the data stored in the synchronous register 303 of each FPGA 106 can be ensured within a predetermined time by mutually connecting the FPGAs 106 of the different information processing devices using the full-duplex serial I/F.

Figure 5:
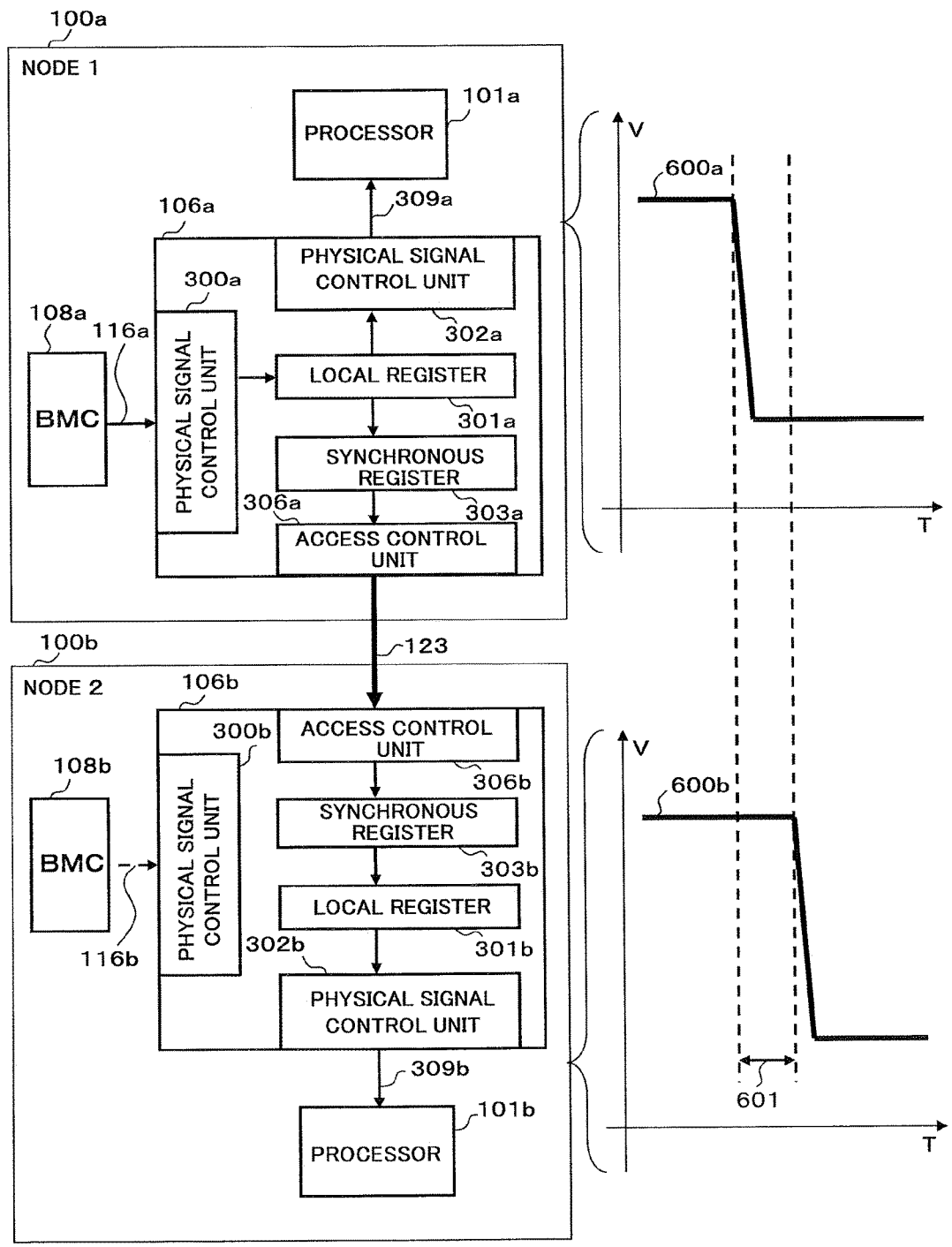
FIG. 5 is a diagram for showing an example of a method in which power saving control is synchronized in plural information processing devices by the FPGAs having the synchronous control mechanism.

FIG. 5 is a diagram for showing an example of a method in which the power saving control is synchronized among the plural information processing devices 100 using the FPGAs 106 having the synchronous control mechanism. The information processing device 100a includes the FPGA 106a, the BMC 108a, and the processor (CPU) 101a.

The processor 101a has external input pins to use a function of reducing the power consumption of the processor 101a by suppressing the operation frequency of the processor 101a and a function of reducing the power consumption from a device other than the processor 101a. The external input pins are connected to the FPGA 106a through the transmission channel 309a.

As described using FIG. 2, the FPGA 106a includes the BMC access control unit 300a, the physical signal control unit 302a, the local register 301a, the synchronous register 303a, and the internode communication access control unit 306a. FIG. 5 shows a configuration necessary to explain the method in which the power saving control is synchronized among the plural information processing devices 100 among those shown in FIG. 2.

The BMC 108a can access the local register 301a of the FPGA 106a through the BMC access control unit 300a of the FPGA 106a.

The FPGA 106a is connected to the FPGA 106b in another information processing device 100b having the same configuration as the information processing device 100a through the full-duplex serial I/F transmission channel 123. The data stored in each of the synchronous registers 303a and 303b of the FPGAs 106a and 106b of the plural information processing devices 100 is synchronized with another by the synchronous control mechanism within a predetermined time.

For example, on the assumption that the information processing device 100a is a node 1 and the information processing device 100b is a node 2, in the case where the power saving control of the node 1 is synchronized with that of the node 2, data flows as shown in FIG. 5. In the case where the power consumption of the information processing device 100a is suppressed, the BMC 108a of the node 1 operates data stored in the local register 303a of the FPGA 106a to control the suppression of the power consumption through the general-purpose I/F. The data of the local register 301a is reflected on the synchronous register 303a. Further, the synchronous register 303b of the FPGA 106b of the node 2 is synchronized with the synchronous register 303a of the node 1 by the synchronous control mechanism through the internode communication access control units 306a and 306b. More specifically, the content of the synchronous register (transmission data) 400 of the synchronous register 303a is reflected on the synchronous register (reception data) 401 of the synchronous register 303b. The synchronous data stored in each of the synchronous registers 303a and 303b of the FPGAs 106a and 106b of the respective nodes matches the content of the local register 301a with that of the local register 301b. The content of each of the local registers 301a and 301b is reflected on the state of the general-purpose input/output pins (GPIO) provided in the physical signal control units 302a and 302b. As described above, the operation of data for the power saving control by the BMC 108a of the node 1 is input into the processors 101a and 101b as physical signals.

In this case, there is a difference time 601 between a voltage transition 600a of the physical signal on the transmission channel 309a and a voltage transition 600b of the physical signal on the transmission channel 309b. In a general case, 0.1 ms to 1 ms is required to synchronize the FPGAs 106 using the synchronous packets, and his is required at the most to process the data in the FPGAs 106. Therefore, the difference time 601 is substantially equal to the time required to synchronize the synchronous registers 303 of the FPGAs 106 of the plural information processing devices 100.

In the case where the operation frequencies of processors are suppressed by a power-saving function of the processors in a multi-processor system, it is desirable to simultaneously control the frequencies of the all processors. For example, if there is a large difference between execution times of transactions in an application executing the same plural transactions in parallel, the execution performance of the entire application is largely affected in some cases. The power saving control is synchronized among the information processing devices using the FPGAs having the synchronous control mechanism, so that the synchronization time of the power saving control can be minimized and the maximum delay time can be ensured as compared to the conventional method in which the synchronization is performed using the BMC F/W. Thus, the impact on the application on the multi-processor system can be minimized.

Second Embodiment

Figure 6:
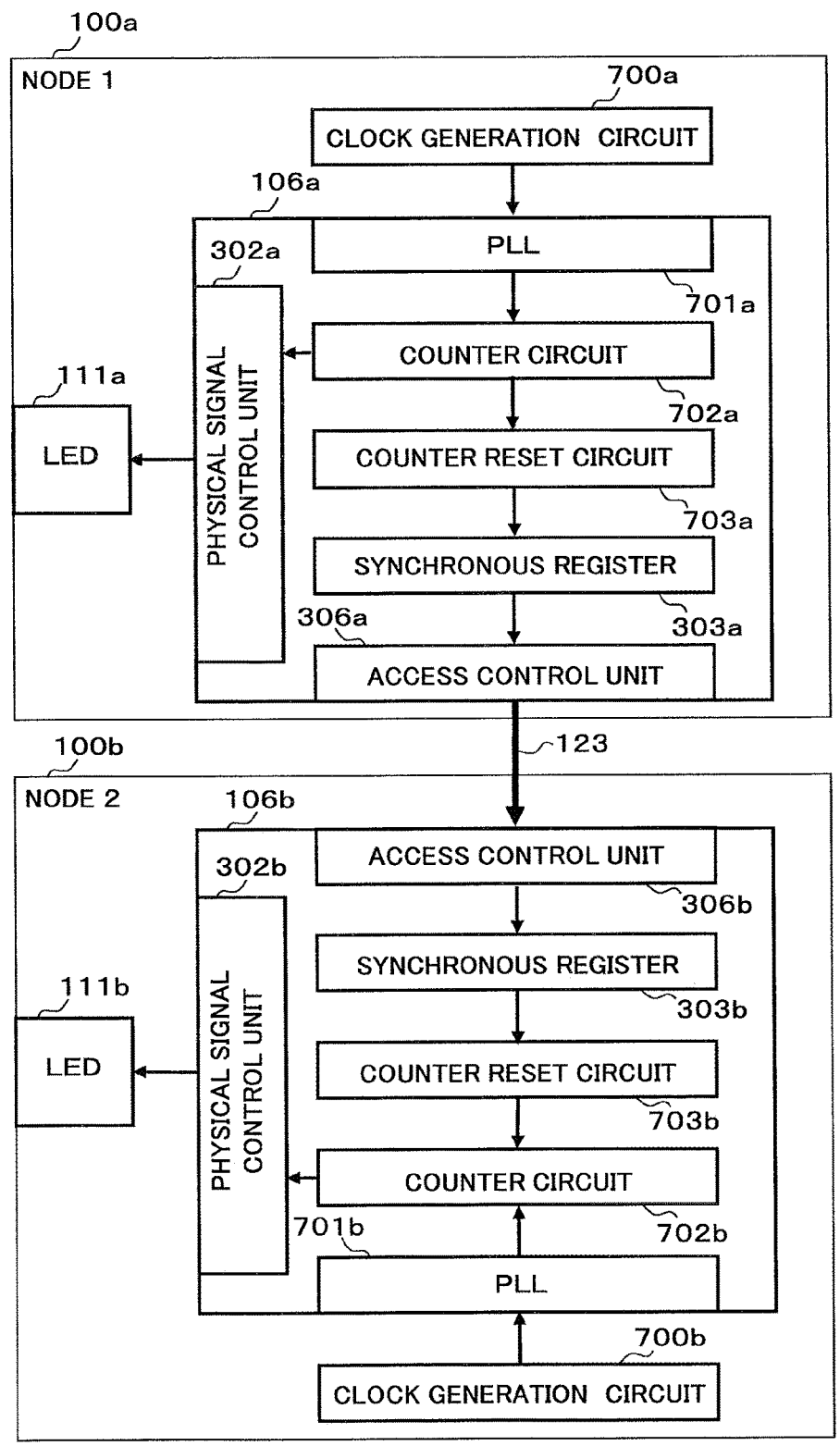
FIG. 6 is a diagram for showing an example of a method in which LED control is synchronized in plural information processing devices by the FPGAs having the synchronous control mechanism.

In the embodiment, an example of synchronizing LED control among plural information processing devices will be described. FIG. 6 is a diagram for showing an example of a method in which the LED control is synchronized among the plural information processing devices using FPGAs having a synchronous control mechanism.

An information processing device 100a includes an FPGA 106a, a clock generation circuit 700a, and an LED 111a. The clock generation circuit 700a supplies a physical signal having a waveform oscillated at a certain frequency to the FPGA 106a.

The FPGA 106a includes a PLL 701a, a clock counter circuit 702a, a counter reset circuit 703a, a synchronous register 303a, an internode communication access control unit 306a, and a physical signal control unit 302a.

The PLL 701a keeps the phase of the clock waveform supplied from the clock generation circuit 700a in a certain shape. The clock counter circuit 702a counts the number of amplitudes (that means to count the waveforms having a predetermined amplitude or higher and that corresponds to a frequency) of the clock waveform shaped by the PLL 701a. The number of counts of the clock counter circuit 702a is finite. The counter reset circuit 703a monitors the number of counts of the clock counter circuit 702a. When the number of counts reaches a predetermined value, the number of counts of the clock counter circuit 702a is reset.

The physical signal control unit 302a monitors the number of counts of the clock counter circuit 702a, and switches turn-on or turn-off of the LED 111a at every predetermined numbers of counts.

The FPGA 106a is connected to an FPGA 106b in another information processing device 100b having the same configuration as the information processing device 100a through a full-duplex serial I/F transmission channel 123. The data stored in each of the synchronous registers 303a and 303b of the FPGAs 106a and 106b of the plural information processing devices 100a and 100b is synchronized with another by the synchronous control mechanism within a predetermined time.

For example, on the assumption that the information processing device 100a is a node 1 and the information processing device 100b is a node 2, in the case where the LED control of the node 1 is synchronized with that of the node 2, data flows as shown in FIG. 6. The FPGAs 106a and 106b of the node 1 and the node 2 allow the clock counter circuits 702a and 702b to operate using the clock signals supplied from the clock generation circuits 700a and 700b, respectively, to switch the states of the LEDs 111a and 111b. However, the counter reset circuit 703a of the node 1 monitors the value of the counter of the clock counter circuit 702a of the node 1. In the case where the value of the counter reaches a predetermined value, the value of the counter of the clock counter circuit 702a of the node 1 is reset, and the data is stored in the synchronous register 303a of the node 1. Further, the synchronous register 303b of the node 2 is synchronized with the synchronous register 303a of the node 1 by the synchronous control mechanism through the internode communication access control units 306a and 306b. The counter reset circuit 703b of the node 2 monitors the synchronous register 303b of the node 2. In the case where the value stored in the synchronous register 303b is changed, the value of the counter of the clock counter circuit 702b of the node 2 is reset, and the flashing timings of the LEDs 111a and 111b of the plural information processing devices 100a and 100b can be synchronized with another.

In general, the clock signals generated by the clock generation circuits of the information processing devices having the same configuration vary in frequency due to manufacturing irregularities. The LED control is synchronized among the information processing devices using the FPGAs having the synchronous control mechanism, so that the low-speed clock signals used for the LED control and the like can be synchronized with each other among the plural information processing devices, and the flashing timings of the LEDs can be synchronized with each other.

Third Embodiment

Figure 7:
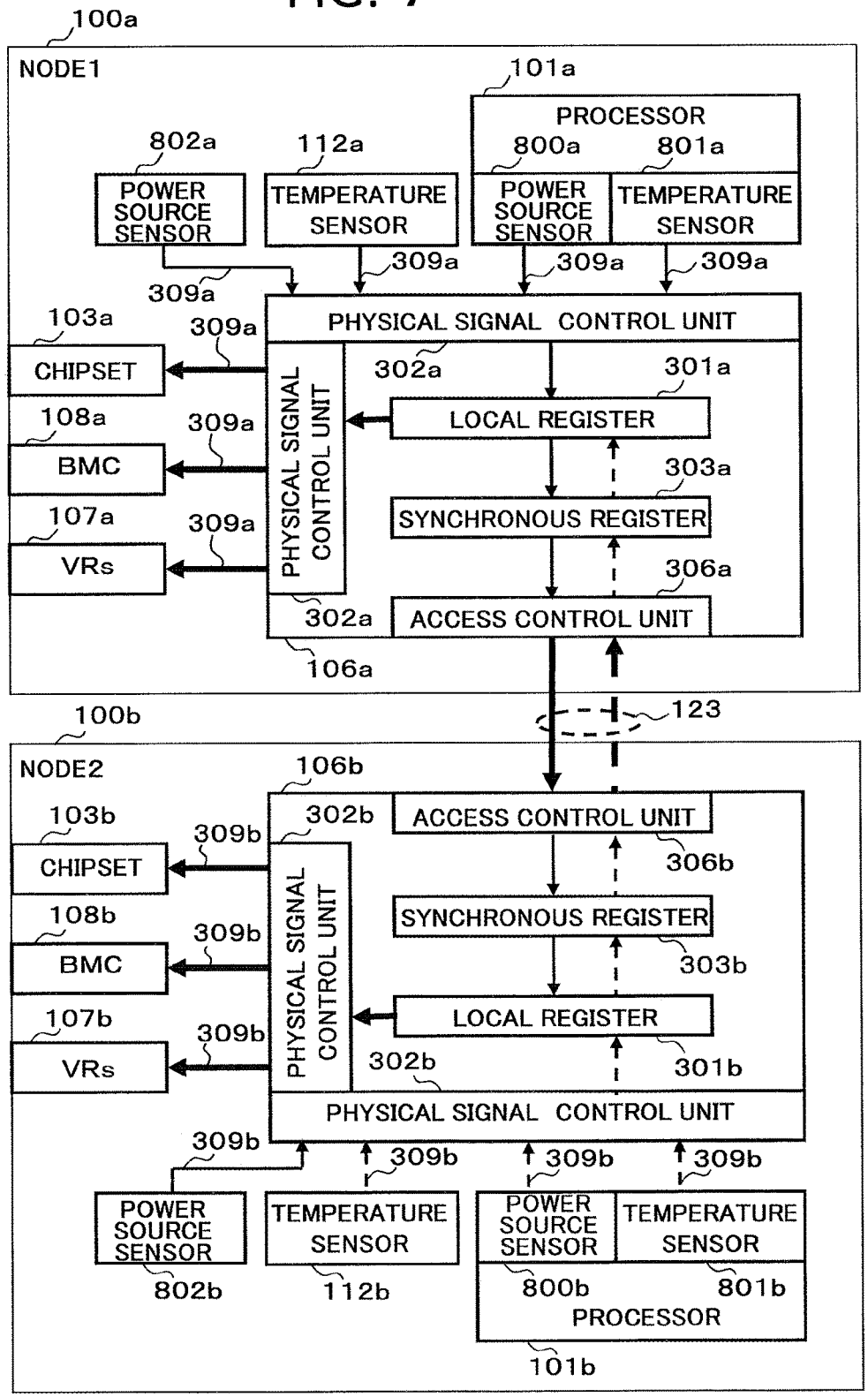
FIG. 7 is a diagram for showing an example of a method in which failure processing control is synchronized in plural information processing devices by the FPGAs having the synchronous control mechanism.

In the embodiment, an example of synchronizing failure processing control among plural information processing devices will be described. FIG. 7 is a diagram for showing an example of a method in which the failure processing control is synchronized among the plural information processing devices using FPGAs having a synchronous control mechanism.

An information processing device 100a includes an FPGA 106a, a processor 101a, a power source sensor 802a, a temperature sensor 112a, a chipset 103a, a BMC 108a, and a power source (VRs) 107a.

The processor 101a includes a power source sensor 800a and a temperature sensor 801a. The power source sensor 800a of the processor 101a has external pins, so that in the case where failure of the power source in the processor 101a occurs, the other devices in the information processing device 100a are notified of the failure of the power source. The power source sensor 800a is connected to the FPGA 106a using a transmission channel 309a. Similarly to the above, the temperature sensor 801a of the processor 101a has external pins, so that in the case where failure of the internal temperature of the processor 101a occurs, the other devices in the information processing device 100a are notified of the failure of the temperature. The temperature sensor 801a is connected to the FPGA 106a using the transmission channel 309a.

The power source sensor 802a has external pins, so that in the case where failure of the power source in the information processing device 100a occurs, the devices in the information processing device 100a are notified of the failure of the power source. The power source sensor 802a is connected to the FPGA 106a using the transmission channel 309a. Similarly to the above, the temperature sensor 112a has external pins, so that in the case where failure of the internal temperature of the information processing device 100a occurs, the devices in the information processing device 100a are notified of the failure of the temperature. The temperature sensor 112a is connected to the FPGA 106a using the transmission channel 309a.

The FPGA 106a includes a physical signal control unit 302a, a local register 301a, a synchronous register 303a, and an internode communication access control unit 306a. In the case where the FPGA 106a receives signals indicating environmental failure from the power source sensors 800a and 802a and the temperature sensors 801a and 112a, the FPGA 106a stores information indicating the occurrence of the environmental failure in the local register 301a, and notifies the chipset 103a and the BMC 108a of the information through general-purpose input/output pins (GPIO) provided in the physical signal control unit 302a. Further, the FPGA 106a controls the power source (VRs) 107a if necessary, and stops the power source of the information processing device 100a.

The FPGA 106a is connected to an FPGA 106b in another information processing device 100b having the same configuration as the information processing device 100a through a full-duplex serial I/F transmission channel 123. The data stored in each of the synchronous registers 303a and 303b of the FPGAs 706a and 106b of the plural information processing devices 100a and 100b is synchronized with another by the synchronous control mechanism within a predetermined time.

For example, on the assumption that the information processing device 100a is a node 1 and the information processing device 100b is a node 2, in the case where the failure processing control of the node 1 is synchronized with that of the node 2, data flows as shown in FIG. 7 (shown by the solid lines). In the case where environmental failure is detected, the sensors (112a, 800a, 801a, and 802a) of the node 1 notify the FPGA 106a of the failure through physical signals. In the case where the notification of the failure is received from each sensor, the FPGA 106a of the node 1 stores the failure regions and the cause into the local register 301a and the synchronous register 303a. The FPGA 106a of the node 1 notifies the chipset 103a and the BMC 108a of the node 1 through the general-purpose input/output pins provided in the physical signal control unit 302a, and controls the power source (VRs) 107a if necessary.

The synchronous register 303b of the FPGA 106b of the node 2 is synchronized with the synchronous register 303a of the node 1 by the synchronous control mechanism through the internode communication access control units 306a and 306b. The FPGA 106a of the node 1 notifies the chipset 103b and the BMC 108b of the node 2 using the state of the synchronous register 303b of the node 1 through the general-purpose input/output pins provided in the physical signal control unit 302b, and controls the power source (VRs) 107b if necessary. In this case, the process of failure can be synchronized among the plural information processing devices. In the case where the failure processing control of the node 2 is synchronized with that of the node 1, the data flows in the direction opposite to the above as the flow (dotted line) shown in FIG. 7.

In general, in the case where the environmental failure of the power source and temperature occurs in the information processing device, it is desirable to perform the process of failure in cooperation with the other information processing devices connected using an SMP connection device in order to secure the consistency and safety of the entire system. The failure processing control is synchronized among the information processing devices using the FPGAs having the synchronous control mechanism, so that the synchronization time of the failure processing control can be minimized and the maximum delay time can be ensured as compared to the conventional method in which the synchronization is performed using the BMC F/W. Thus, the consistency and safety of the entire system can be improved.

Fourth Embodiment

In the embodiment, an example of a method of controlling the states of storage devices from RAID controllers in the case where the RAID controllers and the storage devices (HDDs and SSDs) are mounted in plural different information processing devices will be described.

Figure 8:
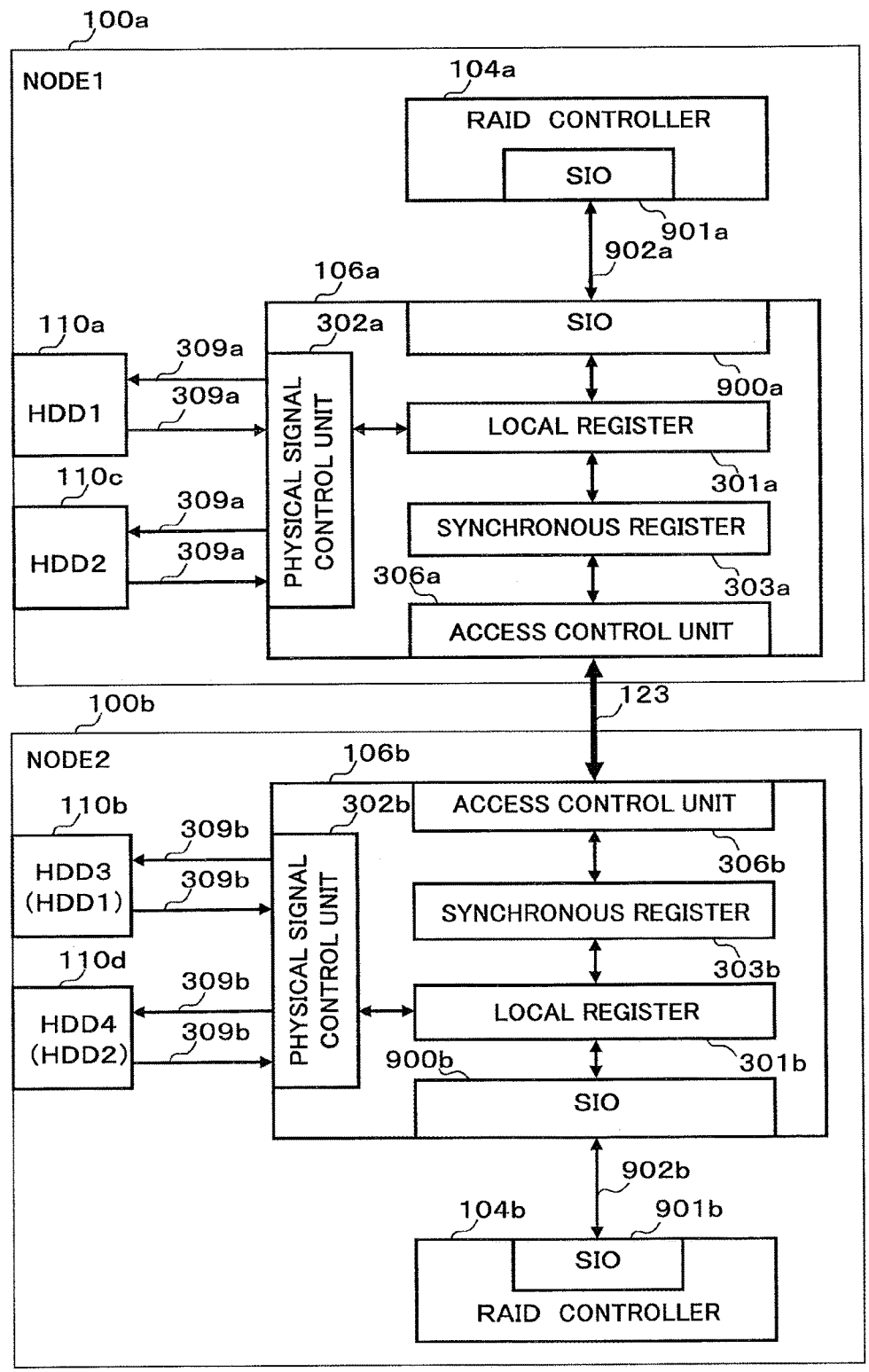
FIG. 8 is a diagram for showing an example of a control method in which the states of storage devices (HDDs and SSDs) are controlled in plural information processing devices by the FPGAs having the synchronous control mechanism in the present invention.

FIG. 8 is a diagram for showing an example of a method of controlling the states of the storage devices from the RAID controllers in the case where the RAID controllers and the storage devices (HDDs and SSDs) are mounted in the plural different information processing devices using FPGAs having a synchronous control mechanism.

An information processing device 100a includes an FPGA 106a, an RAID controller 104a, and one or more storage devices (HDDs) 110a and 110c.

The RAID controller 104a has a general-purpose I/F (SIO or the like) 901a, and is connected to the FPGA 106a through a transmission channel 902a. The RAID controller 104a issues state management commands of the storage devices 110a and 110c to the FPGA 106a through the general-purpose I/F, so that the storage devices 110a and 110c can be controlled (reading of presence information, LED control, and the like) even in a configuration in which the RAID controller 104a is not directly connected to the storage devices 110a and 110c.

The FPGA 106a includes a general-purpose I/F control unit 900a, a local register 301a, a synchronous register 303a, an internode communication access control unit 306a, and a physical signal control unit 302a. The general-purpose I/F control unit 900a decodes the state management commands of the storage devices 110a and 110c issued from the RAID controller 104a, and reflects the same on the local register 301a and the synchronous register 303a, or generates a response command using the value of the local register 301a.

The FPGA 106a is connected to the storage devices 110a and 110c through general-purpose input/output pins (GPIO) provided in the physical signal control unit 302a. The FPGA 106a manages presence information of the storage devices 110a and 110c and the state of the LED through a transmission channel 309a.

The FPGA 106a is connected to an FPGA 106b in another information processing device 100b having the same configuration as the information processing device 100a through a full-duplex serial I/F transmission channel 123. The data stored in each of the synchronous registers 303a and 303b of the FPGAs 106a and 106b of the plural information processing devices 100a and 100b is synchronized with another by the synchronous control mechanism within a predetermined time.

For example, on the assumption that the information processing device 100a is a node 1 and the information processing device 100b is a node 2, in the case where state control is performed, data flows as shown in FIG. 8. The RAID controller 104a of the node 1 issues the state management commands of the storage devices 110a and 110c to the FPGA 106a of the node 1 through the general-purpose I/F. The FPGA 106a of the node 1 transmits the response commend to the RAID controller 104a of the node 1 using the state of the synchronous register 303a of the FPGA 106a of the node 1 synchronized with the synchronous register 303b of the FPGA 106b of the node 2. The RAID controller 104b of the node 2 becomes invalid. In this case, the states of the storage devices 110a and 110c of the node 1 and the states of the storage devices 110b and 110d of the node 2 can be controlled from the RAID controller 104a of the node 1.

In a conventional technique, in the case where a storage device of an information processing device is used from an RAID controller of another information processing device, it is necessary to arrange a main path through which effective data is transmitted and received and a control signal for controlling the state of the storage device on an SMP connection device. Accordingly, the state control of the storage devices among the information processing devices is synchronized using the FPGAs having the synchronous control mechanism, so that the FPGAs can dynamically switch the control signals of the storage devices, and thus the number of physical signals arranged on the SMP connection device can be reduced.

According to the above-described embodiments, the control signals that need to be synchronized with each other in the plural information processing devices are aggregated into the FPGAs, and a state synchronous process through the FPGAs can be realized.

Incidentally, the control signals that are separately arranged in the front plane and the backplane can be reduced, and the cost of the SMP connection device can be reduced. Further, the state synchronous control performed by the BMC F/W is replaced by the FPGAs, so that the development cost of the BMC F/W can be reduced.

What is claimed is:

1. An information processing system, the system comprising:
    a plurality of information processing devices; and
    a system device control module communicatively coupled to each of the plurality of information processing devices;
    wherein each information processing device includes:
    one or more processors,
    a light emitting diode (LED),
    a clock generation circuit,
    a control device, wherein the control device includes a synchronous register, and
    a sensor, wherein the sensor includes at least a temperature sensor or a power source sensor;
    wherein each control device:
    determines the state of a control signal based on a detection of an error by the sensor,
    stores the state of a control signal in the synchronous register based on the clock generation circuit,
    receives one or more synchronous packets from the plurality of information processing devices,
    synchronizes the synchronous register based on the received one or more synchronous packets, and
    synchronously flashes the LED based on the synchronous register.

2. The information processing system according to claim 1, wherein the control device is a Field Programmable Gate Array (FPGA).

3. The information processing system according to claim 1, wherein the state of the control signal is further based on a signal for power saving control.

4. The information processing system according to claim 1, wherein each of the plurality of information processing devices further include a power source device, and
    wherein the state of the control signal is further based on a signal for controlling the power source of each information processing device.

5. The information processing system according to claim 1, wherein each of the plurality of information processing devices further include a Redundant Array of Independent Disks (RAID) controller and a storage device controlled by the RAID controller,
    and wherein the state of the control signal is further based on a control signal from the RAID controller.

6. The information processing system according to claim 1, wherein each of the plurality of information processing devices further include a Local Area Network (LAN) controller that outputs a power-on signal, and the control signal is the power-on signal.

7. A synchronous control method, the method comprising the steps of:
    storing, by a particular information processing device from a plurality of information processing devices, a state of a control signal in a synchronous register based on a detection of an error by a particular sensor of the particular information processing device, wherein each of the plurality of information processing devices includes:
    one or more processors,
    a light emitting diode (LED),
    a clock generation circuit,
    a control device, wherein the control device includes a synchronous register, and
    the sensor, wherein the sensor includes at least a temperature sensor or a power source sensor;
    receiving, by the particular information processing device, one or more synchronous packets from the plurality of information processing devices;
    synchronizing, by the particular information processing device, the synchronous register of the particular information processing device, based on the one or more synchronous packets, and
    synchronously flashing, by the particular information processing device, the LED of the particular information processing device based on the synchronous register.

* * * * *